June 1, 1965 J. E. CLARK 3,187,240

SEMICONDUCTOR DEVICE ENCAPSULATION AND METHOD

Filed Aug. 8, 1961 2 Sheets-Sheet 1

INVENTOR
J. E. CLARK
BY H. W. Lockhart
ATTORNEY

June 1, 1965 J. E. CLARK 3,187,240

SEMICONDUCTOR DEVICE ENCAPSULATION AND METHOD

Filed Aug. 8, 1961 2 Sheets-Sheet 2

INVENTOR
J. E. CLARK
BY H. W. Lockhart
ATTORNEY

United States Patent Office 3,187,240
Patented June 1, 1965

3,187,240
SEMICONDUCTOR DEVICE ENCAPSULATION AND METHOD

James E. Clark, Coopersburg, Pa., assignor to Bell Telephone Laboratories, Incorporated, New York, N.Y., a corporation of New York Filed Aug. 8, 1961, Ser. No. 131,706
7 Claims. (Cl. 317—234)

Figure 1:
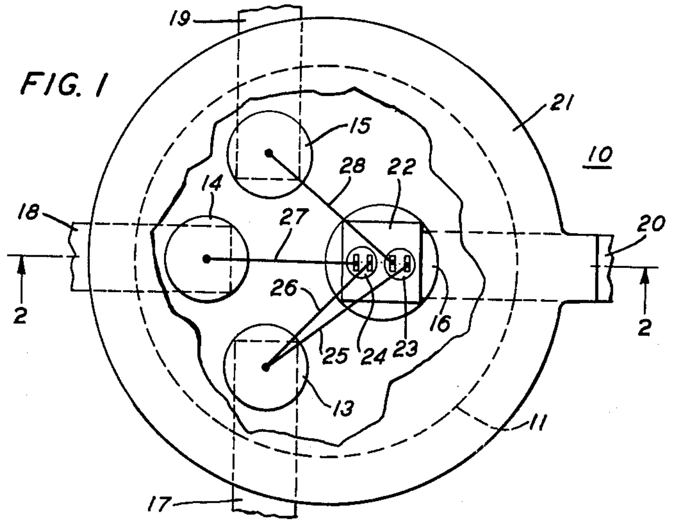

This invention relates to semiconductor encapsulations and to methods for making an encapsulation.

There is a continuing effort to increase the reliability, to decrease the size, and to reduce the cost of housings for encapsulating semiconductor devices. In particular, in an effort to standardize on an encapsulation suitable for miniature electronic apparatus, certain desirable overall dimensions and configurations have been adopted. One particular arrangement has been termed a "pancake" type semiconductor encapsulation. The invention disclosed herein involves a particular structural arrangement and method for realizing a structure of this pancake type.

An object of the invention therefore is an improved semiconductor device encapsulation. In particular, it is an object of this invention to provide a device encapsulation of considerably decreased size which is suitable for housing a variety of types of semiconductor devices.

Another object of the invention is a method for assembling a semiconductor device and particularly the housing thereof which reduces the cost of such assembly.

Basically, the encapsulation arrangement in accordance with this invention comprises a small metal ring having a sealed-in glass disc containing a plurality of stubby metal leads. At one end of the metal ring the glass portion extends beyond the end of the ring. At the other end the ring extends beyond the glass thereby forming a cavity within which the semiconductor device is placed. The stubby metal leads sealed within the glass portion of this header assembly are flush with the surface at the glassed end of the ring but project into the above-mentioned cavity at the other end. These metal leads may be of different lengths and diameters to enable a variety of functions such as the mounting of semiconductor elements or the attachment of wire connectors thereto. Closure of the cavity formed by the metal sleeve and glass disc is accomplished by sealing a flat metal cover plate to the unglassed end of the metal ring. External leads to the device comprise flat metal ribbons bonded to the stubby metal leads on the flush glass surface of the encapsulation. In particular, these leads are arranged in a radial pattern to conform with standardized terminal arrangements.

Particular advantages of reduced size are achieved in this semiconductor encapsulation in combination with an assembly technique which lends itself particularly to an automatic operation. In particular, the header assembly of the encapsulation may be readily fabricated by assembling the several parts of the header; namely, the metal ring, the glass portion, and the stubby leads within a light metal cup which may be formed in a continuous conveyor tape. After a single operation to seal the leads and the ring to the glass, the light metal cup may be torn from the header assembly or the tape having the formed cup therein may be used to convey the part during subsequent assembly operations.

Thus a feature of this invention is a semiconductor housing having a series of short, stubby glass-mounted metal leads which are flush with the glass surface on one face of the encapsulation. Another feature of the invention is the assembly operation in which the respective parts of the header member of the assembly are held in a simple jig during the glass sealing heat treatment.

Figure 2:
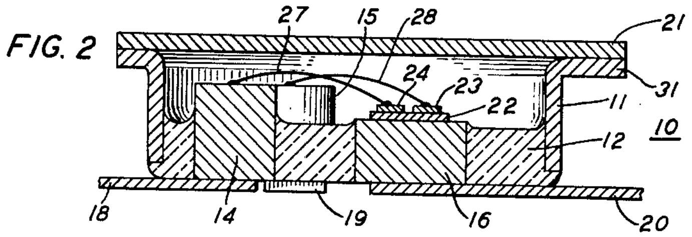
Figure 3:
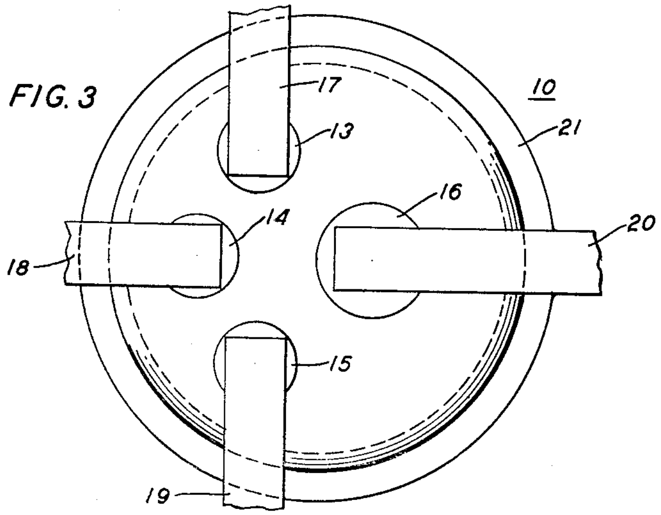
Figure 4:
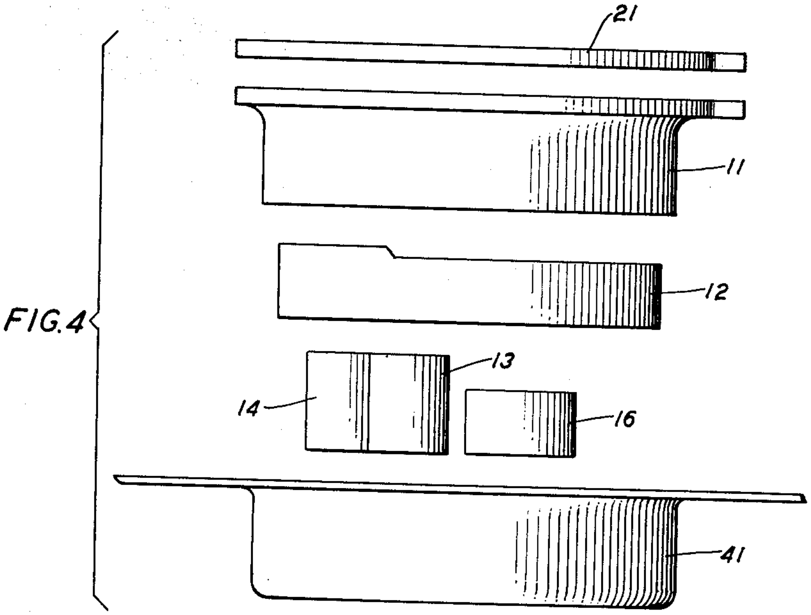
Figure 5:
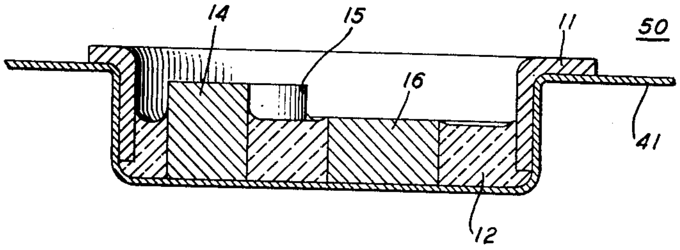

The invention and its further objects and features will be more clearly understood from a consideration of the following detailed description taken in connection with the drawing in which:

FIGS. 1, 2, and 3 are respectively top, side elevation, and bottom views of a semiconductor device in a housing in accordance with this invention. In FIG. 1 the cover member is broken away to enable a view of the semiconductor element and its connections, and FIG. 2 is in section for greater clarity. FIG. 4 is an exploded view showing the relation of the various parts of the encapsulation prior to assembly in the glassing jig, and FIG. 5 is a sectional view showing the header after the glass sealing step within the glassing jig.

Referring to the drawing in which the reference numbers have been applied uniformly to a part as it appears in several figures, and referring particularly to FIGS. 1, 2, and 3, the semiconductor device encapsulation in accordance with this invention comprises a metal ring 11, which typically may be of Kovar, having a flanged portion 31 at one end. Sealed within, and protruding at the other end of the ring, is a glass disc portion 12, typically clearform Corning 7052 glass. Sealed within the glass portion are four stubby mounting pins 13, 14, 15, and 16, typically of Kovar. In this particular arrangement pins 13, 14, and 15 are of the same diameter and length, and pin 16 is slightly larger in diameter and shorter. Pin 16 thus constitutes the primary mounting member upon which is secured a single wafer of semiconductor material 22 which comprises a double mesa device constituting two transistor structures with a common collector region. This type of device is shown simply for purposes of illustration.

As best seen in FIG. 1, each mesa 23 and 24 has on its surface two metallic rectangular stripes providing base and emitter electrodes. Leads 25 and 26 from the base electrodes of both mesas are connected together on pin 13, lead 27 connects the emitter of mesa 24 to pin 14, and lead 28 connects the emitter electrode of mesa 23 to pin 15. The common collector portion is mounted on pin 16. This particular semiconductor element and connections constitute an integrated device for logic switching functions. The encapsulation is closed by a metal cover member 21, which also may be of Kovar, and which is joined to the flanged portion of the metal ring 11.

As shown in FIG. 3, external leads are provided by flat ribbon lead members 17, 18, 19, and 20, for example, of aluminum, which are bonded in a radial pattern to the pin members 13, 14, 15, and 16 at the flush glass surface on the lower side of the header member. Typically, the ring member 11 in this particular arrangement may have a diameter of about .165 inch, and the overall thickness of the encapsulation including the ribbon leads is less than .060 inch.

One particularly advantageous arrangement for fabricating the semiconductor encapsulation disclosed herein comprises forming a thin metal cup member 41, as shown in FIG. 4, which may be formed as one of a series of cups in a moving tape or glassing strip. The preform glass member 12 is then loaded into the cup 41, and the stubby pins 13, 14, 15, and 16 are inserted in the corresponding holes in the glass preform 12. Finally, the ring 11 is loaded into the cup and the entire assembly is heated to a temperature, typically between 900 degrees centigrade and 1000 degrees centigrade, at which the glass fuses and seals to produce the arrangement shown in FIG. 5. In particular, it may be desirable also to produce the ring member 11 as one of a series in a continuous metal tape with a spacing corresponding to the spacing of the cup members formed in the glassing strip. These two tapes may then be brought together and run through the furnace as a continuous assembly and the individual header assemblies separated after removal of the glassing strip.

In certain instances it may be desirable to oxidize prior to glass sealing by heating the pin members and the ring member. This conveniently may be accomplished by tack welding the pins in place in the cup member 41 using the glass preform 12 as a jig. Both the strip from which the ring is formed and the glassing strip carrying the pins may then be fed through an oxidizing furnace prior to the glass sealing heat treatment. Also, in connection with the glass sealing operation, it may be desirable in order to avoid undesirable wetting of the metal by the glass to employ radio frequency induction heating rather than a furnace to accomplish the glass fusion.

After fabrication of the header assembly, the surfaces of the pins 13, 14, 15, and 16 within the enclosure are suitably plated, for example, with gold, to enable bonding of the semiconductor element 22 to the pin 16 and thermocompression bonding of the several leads to the surfaces of pins 13, 14, 15, and 16. Similarly, these leads are thermocompression bonded to the metal stripe electrodes on the mesa portions of the semiconductor element.

Finally, the cover member 21 is joined to the ring member advantageously by glazing the inner surface of the metal plate 21 as well as the abutting portions of the flange 31. The cover then is joined to the ring by a hot glass sealing treatment which avoids furnace heating with the deleterious gases and other contaminants associated with such metal-to-metal bonding operations. In certain applications it may be possible to omit pre-glazing of the surface of the flange 31 and still to produce a satisfactory pressure-type seal. In another alternative technique the cover member is welded to the ring by first applying a tin coating over a gold plating on the cover member. This arrangement is particularly advantageous in overcoming differential thermal expansion problems. Finally, the ribbon members 17, 18, 19, and 20 are bonded to the outer ends of the pin members where they are flush with the glass surface. Advantageously, the ribbon leads are held in proper relation by a simple jig while a bond is made by a thermocompression bonding technique. For such an operation it is desirable to gold plate the surfaces and the pins as well as the surfaces of the ribbons which are to be bonded. Thus there is produced a device encapsulation of greater simplicity and a comparatively lesser number of fabrication operations which is suitable for high temperature and high stress applications. Moreover, it can be recognized that other internal mounting arrangements may be utilized within this general configuration by varying the height and diameter of the mounting pins while at the same time maintaining their relative center-to-center distances.

Although the invention has been disclosed in terms of a particular embodiment, it will be understood that other arrangements may be devised by those skilled in the art which will be within the scope and spirit of the invention.

What is claimed is:

1. A semiconductor device encapsulation comprising a metal sleeve member, a glass member sealed within said sleeve member and extending beyond said sleeve member at one end, said sleeve member extending beyond said glass member at the other end, said extended sleeve portion defining with said glass a cavity, a plurality of metal pins sealed in said glass member, said pins being flush at one end with the surface of said glass member at its extended end, and a metal cover member joined to said extended portion of said sleeve member thereby to enclose said cavity.

2. A semiconductor device encapsulation comprising a metal sleeve member, a glass disc sealed within said sleeve member and extending beyond said sleeve member at one end, said sleeve member extending beyond said glass disc at the other end, said extended sleeve portion having a flanged portion and defining with said disc a cavity, a plurality of metal pins sealed in said disc, said pins being flush with the surface of said disc at its extended end, and a metal cover member joined to said flanged portion of said sleeve thereby to enclose said cavity.

3. A semiconductor device encapsulation comprising a metal sleeve member, a glass disc sealed within said sleeve member and extending beyond said sleeve member at one end, said sleeve member extending beyond said glass disc at the other end, said extended sleeve portion having a flanged portion and defining with said disc a cavity, a plurality of short, thick metal pins sealed in said disc, said pins being flush with the surface of said disc at its extended end, said pins extending into said cavity, and a metal cover member joined to said flanged portion of said sleeve thereby to enclose said cavity.

4. A semiconductor device encapsulation comprising a metal sleeve member, a glass disc sealed within said sleeve member and extending beyond said sleeve member at one end, said sleeve member extending beyond said glass disc at the other end, said extended sleeve portion having a flanged portion and defining with said disc a cavity, a plurality of short, thick metal pins sealed in said disc, said pins being flush with the surface of said disc at its extended end, said pins extending into said cavity, and a metal cover member joined to said flanged portion of said sleeve thereby to enclose said cavity and metal ribbon members bonded to the external ends of said pins, said ribbon members being radially disposed.

5. A semiconductor device comprising a metal sleeve member, a glass disc sealed within said sleeve member and extending beyond said sleeve member at one end, said sleeve member extending beyond said glass disc at the other end, said extended sleeve portion having a flanged portion and defining with said disc a cavity, a plurality of short, thick metal pins sealed in said disc, said pins being flush with the surface of said disc at its extended end, said pins extending into said cavity, and a metal cover member joined to said flanged portion of said sleeve thereby to enclose said cavity and metal ribbon members bonded to the external ends of said pins, said ribbon members being radially disposed, and a semiconductor element mounted in said cavity on the end of one of said pins and a plurality of wire leads interconnecting said element and said other pins within said cavity.

6. In the method of fabricating a semiconductor device which includes a flanged metal sleeve member having a glass portion sealed therein and a cover member, the steps comprising forming a metal supporting cup for nesting the metal sleeve member therein, assembling said sleeve member in said cup, placing a glass disc having a plurality of holes therethrough in said sleeve and resting on the bottom of said cup, placing a short metal pin in each of the holes in said disc, heating said assembly to seal said metal members to said glass disc, mounting a semiconductor element on the inner end of at least one of said pins, interconnecting the electrodes of said element and said pins by bonding wire leads thereto, joining a metal cover member to the unglassed end of said sleeve member and removing said cup member from said assembly.

7. In the method of fabricating a semiconductor device which includes a flanged metal sleeve member having a glass portion sealed therein and a cover member, the steps comprising forming a metal supporting cup for nesting the metal sleeve member therein, assembling said sleeve member in said cup, placing a glass disc having a plurality of holes therethrough in said sleeve and resting on the bottom of said cup, placing a short metal pin in each of the holes in said disc, heating said assembly to seal said metal members to said glass disc, mounting a semiconductor element on the inner end of at least one of said pins, interconnecting the electrodes of said element and said pins by bonding wire leads thereto, joining a metal cover member to the unglassed end of said sleeve member, removing said cup member from said assembly, and bonding a metal ribbon lead in a radical disposition to the external end of at least one of said pins.

References Cited by the Examiner

UNITED STATES PATENTS 2,959,719 11/60 Ezaki ---------------- 317—235

2,963,632 12/60 Kilian et al. ----------- 317—235
3,001,110 9/61 Frazier --------------- 317—234
3,019,283 1/62 Little -------------- 317—101 X
3,021,461 2/62 Oakes et al. ----------- 317—235

DAVID J. GALVIN, *Primary Examiner.*

GEORGE N. WESTBY, *Examiner.*